United States Patent
Shen

(10) Patent No.: US 9,366,923 B2
(45) Date of Patent: Jun. 14, 2016

(54) ARRAY SUBSTRATE AND METHOD OF FABRICATING THE SAME, AND DISPLAY DEVICE

(71) Applicants: BOE TECHNOLOGY GROUP CO., LTD, Beijing (CN); BEIJING BOE OPTOELECTRONICS TECHNOLOGY CO., LTD, Beijing (CN)

(72) Inventor: Qiyu Shen, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

(*) Notice: Subject to any disclaimer, the term of this patent is extended or adjusted under 35 U.S.C. 154(b) by 0 days.

(21) Appl. No.: 14/498,045

(22) Filed: Sep. 26, 2014

(65) Prior Publication Data

US 2015/0253637 A1    Sep. 10, 2015

(30) Foreign Application Priority Data

Mar. 6, 2014    (CN) .......................... 2014 1 0081554

(51) Int. Cl.
   *G02F 1/1362*    (2006.01)
   *H01L 27/12*     (2006.01)
   *H01L 29/66*     (2006.01)
   *G02F 1/1368*    (2006.01)

(52) U.S. Cl.
   CPC ........ *G02F 1/136209* (2013.01); *H01L 27/124* (2013.01); *H01L 27/1248* (2013.01); *H01L 27/1259* (2013.01); *H01L 29/66765* (2013.01); *G02F 1/1368* (2013.01); *G02F 2201/40* (2013.01)

(58) Field of Classification Search
   CPC .................................................. H01L 27/1259
   See application file for complete search history.

(56) References Cited

U.S. PATENT DOCUMENTS

| | | | |
|---|---|---|---|
| 5,414,547 A * | 5/1995 | Matsuo | G02F 1/136209 349/44 |
| 5,510,916 A | 4/1996 | Takahashi | |
| 6,175,395 B1 * | 1/2001 | Yamazaki | G02F 1/133512 349/110 |
| 2007/0064179 A1 | 3/2007 | Park et al. | |
| 2015/0187800 A1 * | 7/2015 | Park | H01L 27/124 349/43 |

FOREIGN PATENT DOCUMENTS

| CN | 103226272 A | 7/2013 |
|---|---|---|
| CN | 103353699 A | 10/2013 |

OTHER PUBLICATIONS

Office Action dated Jan. 27, 2016 issued in corresponding Chinese Application No. 201410081554.9.

* cited by examiner

*Primary Examiner* — Lex Malsawma
(74) *Attorney, Agent, or Firm* — Nath, Goldberg & Meyer; Joshua B. Goldberg; Christopher Thomas

(57) ABSTRACT

The present invention provides an array substrate, a method of fabricating the array substrate, and a display device. The array substrate includes a base substrate and pixel units arranged in a matrix-type manner on the base substrate, a thin film transistor, a first electrode and a second electrode are provided in the pixel unit, the thin film transistor includes a gate, a first insulation layer, an active layer, a source and a drain. The array substrate further includes a black matrix provided above the first electrode, and the black matrix covers a non-display region of each pixel unit.

18 Claims, 9 Drawing Sheets

ARRAY SUBSTRATE AND METHOD OF FABRICATING THE SAME, AND DISPLAY DEVICE

FIELD OF THE INVENTION

The present invention relates to the field of liquid crystal display technology, and more particularly, to an array substrate, a method of fabricating the array substrate, and a display device.

BACKGROUND OF THE INVENTION

A thin film transistor liquid crystal display (TFT-LCD) has the advantages of small size, low power consumption and no radiation. The TFT-LCD has been developed rapidly in recent years, and dominates the current market of panel display. The TFT-LCD is widely used in products with various kinds of size, which covers main electronic products in current information society, such as LCD TV, high definition digital television, computer, mobile phone, car display, projection display, camcorder, digital camera, electronic watch, calculator, electronic equipment, instrument, public display and unreal display, etc.

The TFT-LCD consists of a liquid crystal display panel, a driving circuit and a backlight module, and the liquid crystal display panel is an important component of the TFT-LCD. The liquid crystal display panel is formed by injecting liquid crystal between an array substrate and a color filter substrate, then edges of which are sealed by using seal agent, and then providing polarizers having polarization directions perpendicular to each other on the array substrate and the color filter substrate, respectively. Thin film transistors, pixel electrodes and peripheral circuits are arranged in a matrix-type manner on the array substrate. In the color filter (CF) substrate, a pixel consists of resins of three primary colors of red (R), green (G) and blue (B), and a transparent common electrode is formed.

Referring to FIGS. 1 and 2, the liquid crystal display panel includes a TFT array substrate, a color filter substrate and a liquid crystal layer provided between the TFT array substrate and the color filter array substrate (not illustrated). The TFT array substrate includes a gate 11, a gate line 12 provided at the same layer as the gate 11 and made of the same material as the gate 11, a transparent conductive common electrode 20, a first insulation layer 30, an active layer 40, a data line layer 50 comprising a data line 501, a source 502 and a drain 503, and a pixel electrode 60. The gate 11, the first insulation layer 30, the active layer 40 and the data line layer 50 form a thin film transistor, the gate line 12 is used for supplying turning-on signal to the thin film transistor, and the data line 501 is used for supplying data signal to the pixel electrode 60. The pixel electrode 60 is also a transparent conductive layer and provided at the same layer as the data line layer 50, and the pixel electrode 60 is electrically connected to the drain 503. In order to allow the electrical field between the common electrode 20 and the pixel electrode 60 to affect the liquid crystal provided between the array substrate and the color filter substrate, the pixel electrode 60 is generally designed as a plane-hollowed structure, as shown in FIG. 3. In addition, the pixel electrode 60 may be formed after the data line layer 50 is formed by a patterning process; alternatively, the data line layer 50 may be formed after the pixel electrode 60 is formed by pattering process. Here, the pattering process mainly includes procedures of film coating, exposing, etching, etc.

The array substrate further includes a passivation layer 70 provided on the thin film transistor, the passivation layer 70 protects the thin film transistor from corrosion. The display panel further includes a black matrix 80 provided above the color filter substrate, the black matrix 80 is used for shielding a light leakage region. An region defined by a dashed line AA' and a dashed line BB' is a thin film transistor region or is referred to as a non-display region of the pixel unit (simply referred to as non-display region), and a region defined by a dashed line CC' and the dashed line BB' is a display region of the pixel unit (simply referred to as display region).

In prior art, the procedure of fabricating the above mentioned array substrate includes:

Step 1, depositing a non-transparent metal film layer on a base substrate 10, and forming a pattern comprising the gate 11 and the gate line 12 by a patterning process;

Step 2, depositing a transparent conductive film layer on the pattern comprising the gate 11 and the gate line 12 by a magnetron sputtering method, and forming the transparent common electrode 20 by a patterning process;

Step 3, depositing a silicon oxide or silicon nitride layer on the pattern comprising the common electrode 20 to form the first insulation layer 30;

Step 4, forming an amorphous silicon film layer on the first insulation layer 30, and forming a pattern comprising the low temperature poly-silicon active layer 40 by a patterning process;

Step 5, forming a source and drain metal film on the pattern comprising the active layer 40, and forming a pattern comprising the data line 501, the source 502 and the drain 503 by a pattering process;

Step 6, depositing a silicon nitride or silicon oxide layer on the pattern comprising the data line 501, the source 502 and the drain 503, to form the passivation layer 70 for protecting the thin film transistor from corrosion, and forming a via hole in the passivation layer 70 by a patterning process; and Step 7, depositing a transparent conductive film layer of indium tin oxide on the passivation layer 70 by a magnetron sputtering method, and forming a pattern comprising the pixel electrode 60 by a patterning process, the pixel electrode 60 being connected to the drain 503 through the via hole.

As can be seen from the above discussion of the method of fabricating the thin film transistor array substrate in prior art, the method requires at least seven patterning processes such as exposing, etching, etc., and there exists problems of complicated fabricating process, numerous fabricating procedure, high cost and long time consuming in the method.

Further, in order to block the light from the light leakage region, in the display panel in prior art, the black matrixes are provided on the color filter substrate. In the design, a width of the black matrix is equivalent to a sum of a width of the light leakage region and a tolerant error or permissible error for alignment of the array substrate and the color filter substrate (hereinafter referred to as the alignment permissible error). Since the alignment permissible error is relatively great, the width d1 of the black matrix provided on the color filter substrate is relatively great, resulting in defects of low aperture ratio and low display luminance in the TFT-LCD.

SUMMARY OF THE INVENTION

The embodiments of the present invention provide an array substrate, a method of fabricating the array substrate, and a display device, to solve the technical problems of complicated fabricating process, high cost and long time consuming in prior art, while increasing the aperture ratio.

An array substrate according to the embodiments of the present invention includes a base substrate and pixel units arranged in a matrix-type manner on the base substrate, a thin film transistor, a first electrode and a second electrode are provided in the pixel unit, the thin film transistor includes a gate, a first insulation layer, an active layer, a source and a drain, wherein the array substrate further includes a black matrix provided above the first electrode, and the black matrix covers a non-display region of each pixel unit.

In the array substrate, the black matrix is provided above the first electrode, and the black matrix and the first electrode may be formed by a single patterning process, thereby the process procedure of fabricating the black matrix may be omitted, and the fabricating process may be simplified, while achieving the object of saving fabricating cost and reducing fabricating period. Meanwhile, as the black matrix is provided on the array substrate, there is no need to consider the alignment permissible error, and the width of the black matrix in the array substrate according to the embodiment is less than that of the black matrix in the array substrate in prior art, which facilitates increment of the aperture ratio of the pixel.

The black matrix may be made of non-transparent metal material, and the black matrix fabricated by using the non-transparent metal material has a good light shielding function. Meanwhile, when the first electrode is a common electrode, since a resistance of the non-transparent metal material is far less than that of the transparent conductive material for fabricating the common electrode, in a case where the black matrix and the first electrode are connected in parallel, the parallel resistance is far less than the resistance of the common electrode, and thus a voltage difference due to the resistance of the common electrode may be effectively reduced. In addition, the black matrix may be formed by using other non-transparent material.

The array substrate may further include a second insulation layer, a covering region of the second insulation layer is overlapped with covering regions of the black matrix and the first electrode, the second insulation layer allows the black matrix and the first electrode to be insulated from the thin film transistor.

The array substrate may further include a passivation layer which is provided above a layer at which the thin film transistor locates and below the second electrode, and covers a region above the thin film transistor. The passivation layer is mainly used for protecting the thin film transistor from corrosion.

In some embodiments, the black matrix may be provided between the thin film transistor and the base substrate, and the second insulation layer may be provided between the black matrix and the thin film transistor, for allowing the black matrix to be insulated from the thin film transistor.

The first electrode may be a common electrode, and the second electrode may be a pixel electrode. The common electrode is a plate electrode, the pixel electrode is a stripe electrode, and the pixel electrode is electrically connected to the drain of the thin film transistor through a first via hole penetrating through the passivation layer. The black matrix may be provided on an upper surface of the common electrode, and the common electrode is electrically connected to the black matrix.

Alternatively, the first electrode may comprise a pixel electrode, and the second electrode may be a common electrode. The pixel electrode is a plate electrode, the common electrode is a stripe electrode, and the drain of the thin film transistor is electrically connected to the pixel electrode through a second via hole penetrating through the second insulation layer. The first electrode may further comprise a dummy electrode, the dummy electrode and the pixel electrode may be provided in the same layer, and the black matrix may be provided on an upper surface of the dummy electrode. The pixel electrode is located at a display region of the pixel unit, the dummy electrode is located at the non-display region of the pixel unit, and the pixel electrode is electrically separated from the dummy electrode.

In some embodiments, the black matrix may be provided between the thin film transistor and the passivation layer, and the second insulation layer may be provided between the black matrix and the thin film transistor.

The first electrode may comprise a pixel electrode, and the second electrode may be a common electrode. The pixel electrode is a plate electrode, the common electrode is a stripe electrode, and the pixel electrode is electrically connected to the drain of the thin film transistor through a second via hole penetrating through the second insulation layer. The first electrode may further comprise a dummy electrode, the dummy electrode and the pixel electrode may be provided in the same layer, the dummy electrode may be provided on an upper surface of the second insulation layer, and the black matrix may be provided on an upper surface of the dummy electrode. The pixel electrode is located at a display region of the pixel unit, the dummy electrode is located at the non-display region of the pixel unit, and the pixel electrode is electrically separated from the dummy electrode.

Alternatively, the first electrode may be a pixel electrode, and the second electrode may comprise a common electrode. The pixel electrode is a plate electrode, the common electrode is a stripe electrode, the pixel electrode and the source and the drain of the thin film transistor are provided in the same layer, and the pixel electrode is directly electrically connected to the drain. The second electrode may further comprise a dummy electrode, the dummy electrode and the common electrode may be provided in the same layer, the dummy electrode may be provided on an upper surface of the second insulation layer, and the black matrix may be provided on an upper surface of the dummy electrode. The common electrode is located at a display region of the pixel unit, the dummy electrode is located at the non-display region of the pixel unit, and the common electrode is electrically separated from the dummy electrode.

After the array substrate according to the embodiments of the present invention is powered on, a horizontal driving electric field is generated under the joint action of the first electrode and the second electrode, the horizontal driving electric field drives the liquid crystal molecules to deflect, so that display of image is achieved.

The embodiments of the present invention provide a display device, and the display device includes the array substrate described above.

The embodiments of the present invention provide a method of fabricating an array substrate, including steps of: forming a pattern comprising a first electrode and a black matrix on a base substrate, the black matrix being provided above the first electrode and covering a non-display region of each pixel unit; and forming a pattern comprising a thin film transistor and a second electrode on the base substrate.

In the method of fabricating the array substrate, the black matrix and the first electrode may be formed by a single patterning process, thereby the process procedure of fabricating the array substrate is simplified, and the fabricating process is simplified, while achieving the object of saving fabricating cost and reducing fabricating period. Meanwhile, the black matrix is provided on the array substrate, there is no need to consider the alignment permissible error, and the width of the black matrix in the array substrate according to the embodiment is less than that of the black matrix in the array substrate in prior art, which facilitates increment of the aperture ratio of the pixel.

The black matrix may be formed by using non-transparent metal material. The black matrix fabricated by using the non-transparent metal material has a good light shielding function. Meanwhile, when the first electrode is a common electrode, since a resistance of the non-transparent metal material is far less than that of the transparent conductive material for fabricating the common electrode, in a case where the black matrix and the first electrode are connected in parallel, the parallel resistance is far less than the resistance of the common electrode, and thus a voltage difference due to the resistance of the common electrode may be effectively reduced. In addition, the black matrix may be formed by using other non-transparent materials.

In the method, the first electrode may comprise a function electrode and a dummy electrode, the function electrode is located at a display region of the pixel unit, and the dummy electrode is located at the non-display region of the pixel unit. The black matrix may be formed on an upper surface of the dummy electrode, and the function electrode is electrically separated from the dummy electrode. The function electrode may be a pixel electrode or a common electrode.

The method may further include a step of forming a second insulation layer on the pattern comprising the first electrode and the black matrix, a covering region of the second insulation layer is overlapped with covering regions of the black matrix and the first electrode, the second insulation layer is used for allowing the black matrix and the first electrode to be insulated from the thin film transistor. In addition, in a case where the first electrode comprises the pixel electrode, a second via hole may be formed in the second insulation layer by a patterning process, so that the pixel electrode may be connected to the drain of the thin film transistor through the second via hole.

The step of forming the pattern comprising the thin film transistor and the second electrode on the base substrate may include: forming a pattern comprising a source and a drain on the second insulation layer; forming a pattern comprising an active layer, a first insulation layer and a gate on the pattern comprising the source and the drain; and forming a pattern comprising a passivation layer on the pattern comprising the active layer, the first insulation layer and the gate, the passivation layer covering the thin film transistor.

By the above steps, a top-gate type thin film transistor may be formed. In the procedure of forming the top-gate type thin film transistor, the active layer, the first insulation layer and the gate may be formed by a single patterning process, thereby reducing number of the process procedures and simplifying the fabricating process, while achieving the object of saving fabricating cost and reducing fabricating period. In addition, the passivation layer is mainly used for protecting the thin film transistor from corrosion.

The method may further include a step of forming the second electrode on the pattern comprising the passivation layer. The second electrode is located at the display region of the pixel unit.

In a case where the second electrode is the pixel electrode, the method may further include a step of forming a first via hole in the passivation layer. The second electrode is electrically connected to the drain of the thin film transistor through the first via hole.

DESCRIPTION OF THE PREFERRED EMBODIMENT

The embodiments of the present invention provide an array substrate, a method of fabricating the array substrate, and a display device, to solve the technical problems of complicate fabricating process, high cost and long time consuming in prior art, while increasing the aperture ratio.

Hereinafter, the technical solutions in the embodiments of the present invention will be described clearly and completely with reference to the accompanying drawings in the embodiments of the present invention. It should be understood that the embodiments described herein are only a part of the embodiments of the present invention, but not the whole embodiments. All of the other embodiments obtained based on the embodiments of the present invention without making creative efforts by those skilled in the art are within the protection scope of the present invention.

Figure 1:
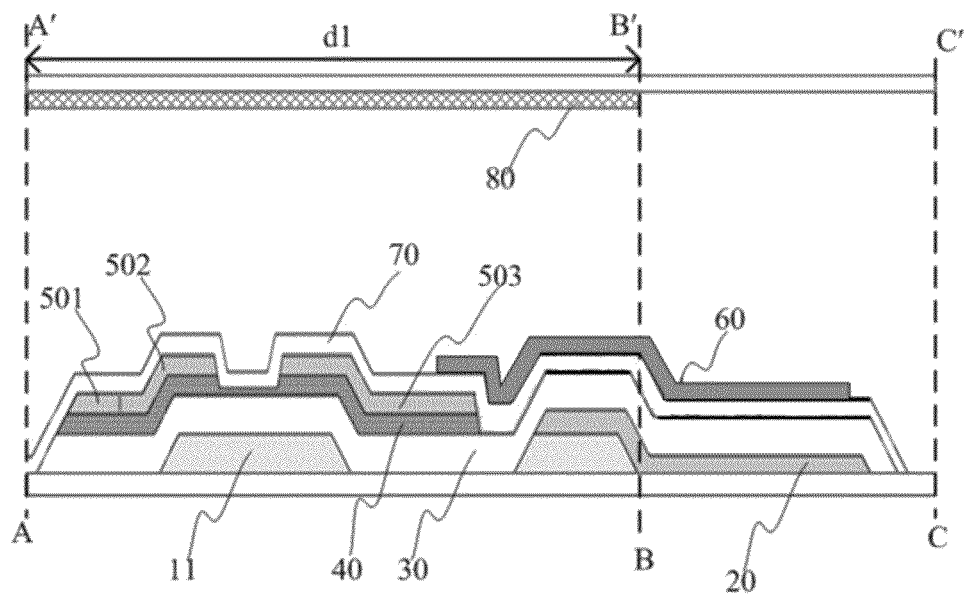
FIG. 1 is a cross sectional diagram of a structure of a display panel in prior art.
Figure 2:
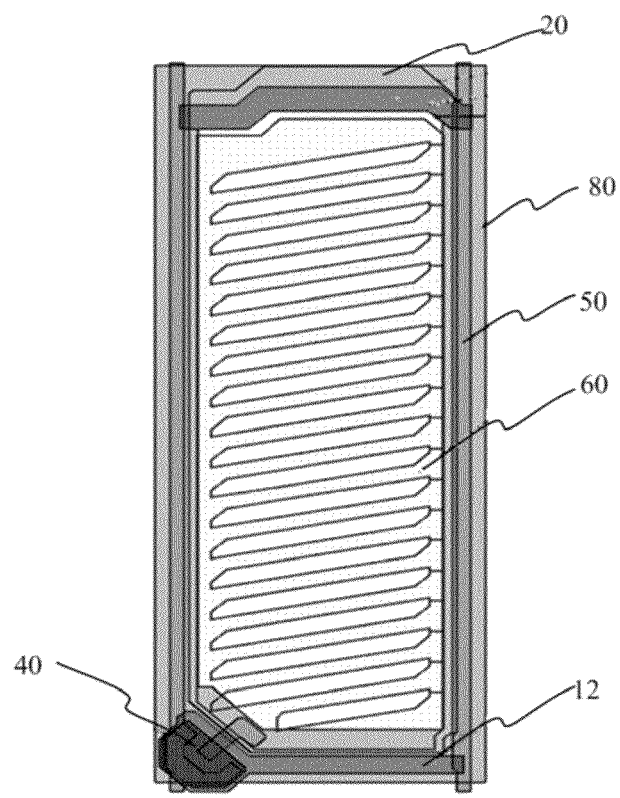
FIG. 2 is a plan view of the structure of the display panel in FIG. 1.
Figure 3:
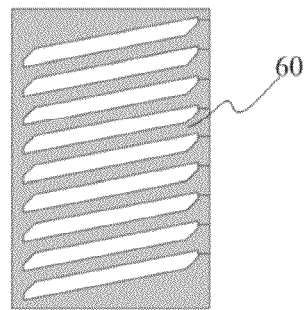
FIG. 3 is a plan view of the structure of a pixel electrode.
Figure 4:
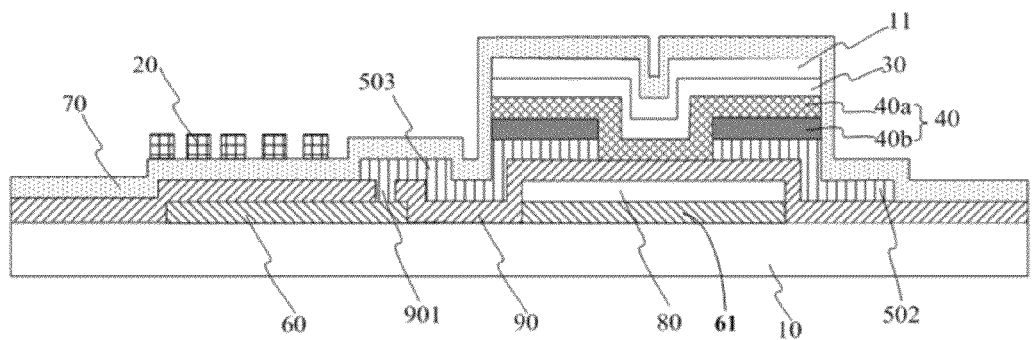
FIG. 4 is a cross sectional diagram of a structure of an array substrate according to a first embodiment of the present invention.
Figure 5:
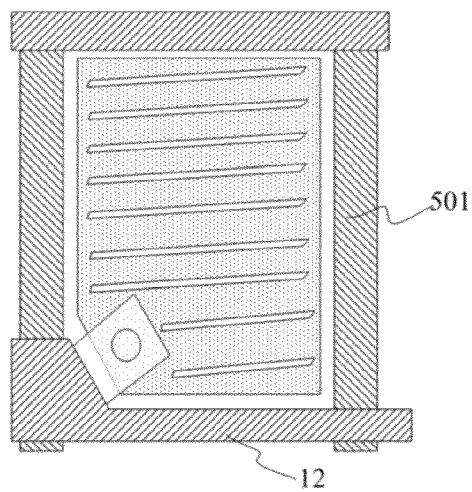
FIG. 5 is a plan view of the structure of the array substrate in FIG. 4.

Referring to FIGS. 4 and 5, a first embodiment of the present invention provides an array substrate. FIG. 4 is a cross sectional diagram of a structure of the array substrate according to the first embodiment of the present invention, and FIG. 5 is a plan view of the structure of the array substrate in FIG. 4. As can be seen from the FIGS. 4 and 5, the array substrate includes a base substrate 10, a gate 11, a first insulation layer 30, an active layer 40, a data line layer 50 comprising a data line 501, a source 502 and a drain 503, a passivation layer 70, a black matrix 80, a second insulation layer 90, a first electrode, and a second electrode. The first electrode comprises a pixel electrode 60 and a dummy electrode 61, the second electrode is a common electrode 20, the pixel electrode 60 is a plate electrode or a stripe electrode, and the common electrode 20 is a stripe electrode.

More specifically, the pixel electrode 60 and the dummy electrode 61 are provided between the base substrate 10 and the black matrix 80. The pixel electrode 60 and the dummy electrode 61 may be made of transparent conductive material, such as indium tin oxide, indium zinc oxide or zinc aluminum oxide, etc. The pixel electrode 60 and the dummy electrode 61 may be provided at the same layer. The pixel electrode 60 and the dummy electrode 61 may be formed by a single patterning process. The pixel electrode 60 is located at a display region, the dummy electrode 61 is located at a non-display region, and the pixel electrode 60 is electrically separated from the dummy electrode 61.

The black matrix 80 is provided between the dummy electrode 61 and the second insulation layer 90, the black matrix 80 may be provided on an upper surface of the dummy electrode 61, and covers the non-display region of each pixel unit. The black matrix 80 is made of non-transparent metal material, the black matrix 80 fabricated by utilizing the non-transparent metal material has a good shading effect, and effectively prevents light of a backlight from irradiating the active layer region of the thin film transistor, thereby reducing a dark current in the thin film transistor. Further, utilization of the metal material facilitates fabrication of the black matrix by a patterning process. In addition, the black matrix may be made of other non-transparent materials, such as a carbon black resin material and a light absorbing resin material.

Note that, a covering region of the pixel electrode 60 is not overlapped with a covering region of the black matrix 80. In order to simplify the fabricating process, in the procedure of fabricating the pixel electrode 60 and the black matrix 80 by a single patterning process, the transparent conductive material (i.e., the dummy electrode 61) provided directly below the black matrix 80 cannot be etched away. However, the portion of the transparent conductive material (the dummy electrode 61) which cannot be etched away is electrically separated from the pixel electrode 60, and no signal is transmitted in the dummy electrode 61.

The second insulation layer 90 is provided above the black matrix 80, and is provided below the thin film transistor. A covering region of the second insulation layer 90 is overlapped with the covering regions of the black matrix 80 and the pixel electrode 60, so that the black matrix 80 and the pixel electrode 60 are insulated from the thin film transistor. The second insulation layer 90 may be made of transparent insulation material, such as silicon oxide or silicon nitride.

Further, a second via hole 901 is provided in the second insulation layer 90, and is filled with the conductive material for fabricating the source 502 and the drain 503. The drain 503 of the thin film transistor is electrically connected to the pixel electrode 60 through the second via hole 901.

The data line 501, the source 502 and the drain 503 are provided at the same layer and provided above the layer at which the second insulation layer 90 locates, and are made of the same material. The data line 501 is electrically connected to the source 502, and is provided across the gate 12. The source 502 and the drain 503 are provided on the second insulation layer 90, and the drain 503 is electrically connected to the pixel electrode 60 through the second via hole 901.

The active layer 40 is provided above the data line 501, the source 502 and the drain 503. The active layer 40 is of a film layer structure, and includes a semiconductor material layer 40a and an ohmic contact layer 40b. In this embodiment, the semiconductor material layer 40a may be made of amorphous silicon material or poly-silicon material. Alternatively, the semiconductor material layer 40a may be made of indium gallium zinc oxide or other transition metal oxides. The ohmic contact layer 40b is provided below the semiconductor material layer 40a and provided above the positions corresponding to the source 502 and the source 503, and may be made of phosphorus-doped amorphous silicon material.

The first insulation layer 30 is provided on the active layer 40 and covers regions above the active layer 40, so that the active layer 40 is insulated from the gate provided above the active layer 40. The first insulation layer 30 may be made of transparent insulation material, such as silicon oxide or silicon nitride.

The gate 11 and the gate line 12 are provided at the same layer and provided on the first insulation layer 30. The gate 11 is made of the same material as the gate line 12, the material may be non-transparent metal such as Cr, W, Ti, Mo, Al and Cu, or alloys thereof.

The passivation layer 70 is provided on the layer at which the thin film transistor locates, and covers regions above the thin film transistor, so as to protect the thin film transistor from corrosion. The passivation layer 70 may be made of transparent insulation material, such as silicon oxide or silicon nitride.

The common electrode 20 is provided on the passivation layer 70. The common electrode 20 is the stripe electrode, and is made of the same material as the pixel electrode 60, for example, the transparent conductive material, such as indium tin oxide, indium zinc oxide or zinc aluminum oxide.

Figure 6:
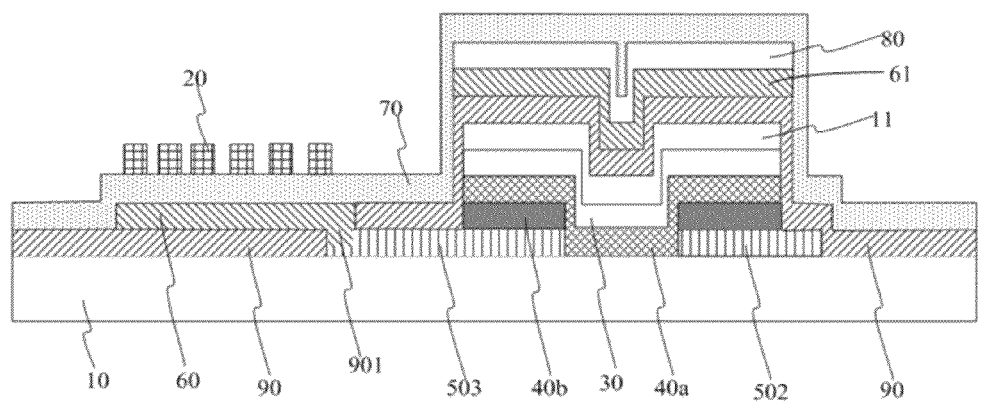
FIG. 6 is a cross sectional diagram of a structure of an array substrate according to a second embodiment of the present invention.

Referring to FIG. 6, a second embodiment of the present invention provides an array substrate, wherein a first electrode comprises a pixel electrode 60 and a dummy electrode 61, and a second electrode is a common electrode 20. As shown in FIG. 6, the structure of the array substrate according to the second embodiment of the present invention is similar to that of the array substrate according to the first embodiment of the present invention, and the differences therebetween are that: in the array substrate according to the second embodiment, the second insulation layer 90 is provided above the layer at which the thin film transistor locates, the pixel electrode 60 and the dummy electrode 61 are provide on the second insulation layer 90, and the black matrix 80 is provided between the dummy electrode 61 and the passivation layer 70. More specifically, the dummy electrode 61 may be provided on an upper surface of the second insulation layer 90, the black matrix 80 may be provided on an upper surface of the dummy electrode 61, and the passivation layer 70 covers the black matrix 80. In addition, the second via hole 901 is provided in the second insulation layer 90, and the pixel electrode 60 is electrically connected to the drain 503 of the thin film transistor through the second via hole 901. The pixel electrode 60 and the dummy electrode 61 may be provided in the same layer. The pixel electrode 60 and the dummy electrode 61 may be formed by a single patterning process. The pixel electrode 60 is located at a display region, the dummy electrode 61 is located at a non-display region, and the pixel electrode 60 is electrically separated from the dummy electrode 61.

Further, since the black matrix 80 is provided above the thin film transistor, it may not block the light from the backlight for the thin film transistor. In the second embodiment of the present invention, in order to reduce the dark current in the thin film transistor due to the backlight, the material for fabricating the active layer of the thin film transistor may be selected from indium gallium zinc oxide or other transition metal oxide material which is not sensitive to light, thereby reducing the dark current in the thin film transistor.

Figure 7:
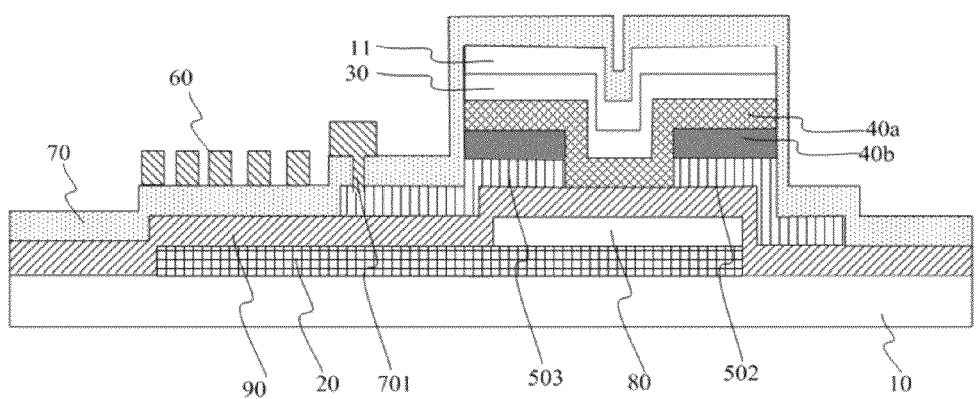
FIG. 7 is a cross sectional diagram of a structure of an array substrate according to a third embodiment of the present invention.

Referring to FIG. 7, a third embodiment of the present invention provides an array substrate. FIG. 7 is a cross sectional diagram of the structure of the array substrate according to the third embodiment of the present invention. As can be seen from FIG. 7, the structure of the array substrate according to the third embodiment of the present invention is similar to that of the array substrate according to the first embodiment of the present invention, and the differences therebetween are that: in the array substrate according to the third embodiment, the first electrode is the common electrode 20, the second electrode is the pixel electrode 60, the common electrode 20 is a plate electrode or a stripe electrode, and the pixel electrode 60 is a stripe electrode; the black matrix 80 may be provided on an upper surface of the common electrode 20, and the black matrix 80 is electrically connected to the common electrode 20. Since the resistance of the black matrix in the electrically connected portion is connected in parallel with the resistance of the common electrode, and the resistance of the black matrix in the electrically connected portion is far less than that of the common electrode, therefore the total parallel resistance is far less than the resistance of the common electrode, and thus a voltage difference due to the resistance of the common electrode is reduced.

Here, since the second electrode is the pixel electrode 60, a first via hole 701 for allowing the pixel electrode to be connected to the drain of the thin film transistor is provided in the passivation layer 70, and the transparent conductive material for fabricating the pixel electrode is filled in the first via hole 701.

Figure 8:
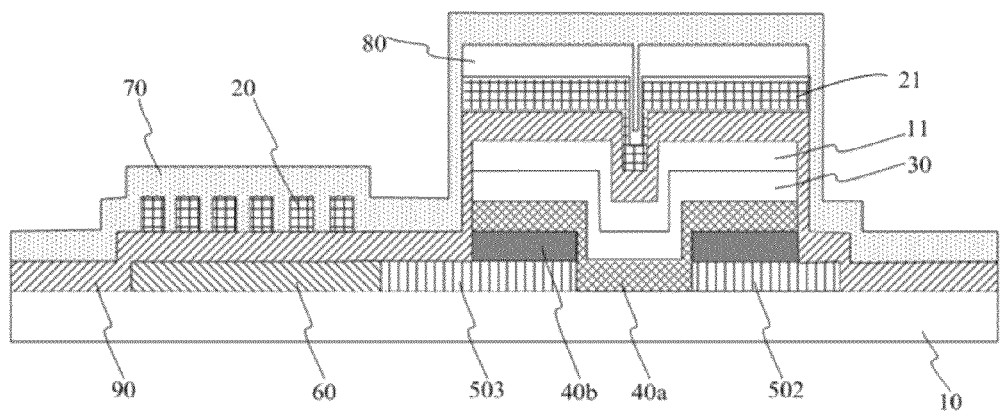
FIG. 8 is a cross sectional diagram of a structure of an array substrate according to a fourth embodiment of the present invention.

Referring to FIG. 8, a fourth embodiment of the present invention provides an array substrate. FIG. 8 is a cross sectional diagram of the structure of the array substrate according to the fourth embodiment of the present invention. In the fourth embodiment, the first electrode comprises the common electrode 20 and a dummy electrode 21, the second electrode is the pixel electrode 60, the common electrode 20 is a stripe electrode, and the pixel electrode 60 is a stripe electrode or a plate electrode. The black matrix 80 and the dummy electrode 21 may be provided above the thin film transistor. The common electrode 20 and the dummy electrode 21 may be provided in the same layer. The common electrode 20 and the dummy electrode 21 may be formed by a single patterning process. The common electrode 20 is located at a display region, the dummy electrode 21 is located at a non-display region, and the common electrode 20 is electrically separated from the dummy electrode 21.

More specifically, the thin film transistor is provided on the base substrate 10, and the thin film transistor is a top-gate type thin film transistor. The pixel electrode 60, the source 502 and the drain 503 of the thin film transistor are provided in the same layer, and the pixel electrode 60 is directly electrically connected to the drain 503 of the thin film transistor. The second insulation layer 90 is provided above the pixel electrode 60 and the thin film transistor, so that the pixel electrode 60 and the thin film transistor are insulated from the common electrode 20 provided above the second insulation layer 90. The common electrode 20 is provided on the second insulation layer 90. The black matrix 80 is provided above the common electrode 20 and the dummy electrode 21, more specifically, the dummy electrode 21 may be provided on an upper surface of the second insulation layer 90, and the black matrix 80 may be provided on an upper surface of the dummy electrode 21. The passivation layer 70 is provided above the common electrode 20 and covers the black matrix 80, and the black matrix 80 covers the non-display region of each pixel unit.

Each of the array substrates according to the first through fourth embodiments includes the black matrix provided on the dummy electrode. Since the black matrix is provided on the array substrate, there is no need to consider the alignment permissible error, which facilitates the reduction of the width of the black matrix and increment of the aperture ratio of the pixel. Meanwhile, since the black matrix is provided on the dummy electrode, the first electrode and the black matrix may be formed by a single patterning process, thereby the process procedure of fabricating the black matrix is omitted, and the fabricating process is simplified, while achieving the object of saving fabricating cost and reducing fabricating period. In addition, after the array substrate according to the embodiments of the present invention is powered on, a horizontal driving electric field is generated under the joint action of the first electrode and the second electrode, the horizontal driving electric field drives the liquid crystal molecules above the the first electrode and the second electrode to deflect, so that display of image is achieved.

In the fifth embodiment of the present invention, there is provided a method of fabricating an array substrate, including: forming a pattern comprising a first electrode and a black matrix on a base substrate, the black matrix being provided above the first electrode and covering a non-display region of each pixel unit; and forming a pattern comprising a thin film transistor and a second electrode on the base substrate.

In the method of fabricating the array substrate, the black matrix and the first electrode may be formed by a single patterning process, thereby simplifying the process procedure of fabricating the array substrate, and simplifying the fabricating process, while achieving the object of saving fabricating cost and reducing fabricating period. Meanwhile, the black matrix is provided on the array substrate, there is no need to consider the alignment permissible error, and the width of the black matrix in the array substrate according to the embodiment is less than that of the black matrix in the array substrate in prior art, which facilitates increment of the aperture ratio of the pixel.

Hereinafter, taking the array substrate according to the first embodiment of the present invention as an example, the method of fabricating the array substrate will be described in detail, the method includes following six steps.

In the first step, referring to FIGS. 9A through 9F, a transparent conductive layer and a metal layer are simultaneously deposited on a base substrate 10 through a single process, the transparent conductive layer may be formed by using transparent conductive material such as indium tin oxide, indium zinc oxide or zinc aluminum oxide, and the metal layer may be formed by using non-transparent metal such as Mo, Al or Cu, or alloys thereof. Then, a pattern comprising a pixel electrode 60 and a black matrix 80 is formed by a patterning process.

More specifically, the step of forming the pixel electrode and the black matrix by the patterning process includes follow steps.

Figure 9A:
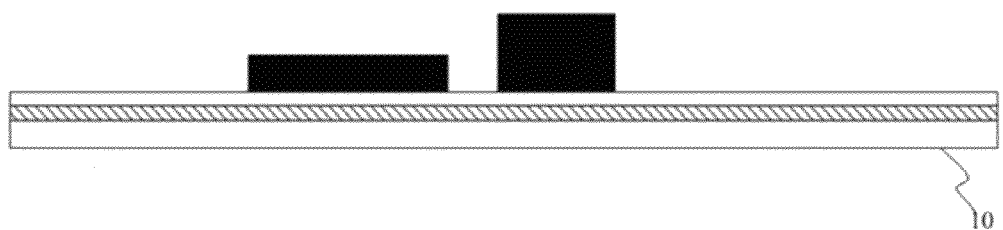
FIGS. 9A through 9F are cross sectional diagrams of the structure of the array substrate in a procedure of fabricating a pixel electrode and a black matrix.

Referring to FIG. 9A, a metal layer for forming the transparent conductive layer and a metal layer for forming the black matrix are formed on the base substrate; next, a layer of photoresist is coated on the metal layer, and corresponding mask plate is utilized, an region of the mask plate corresponding to the pixel electrode being a semi-transmissive region and an region of the mask plate corresponding to the black matrix being a non-transmissive region, to form a photoresist residue with half of the original thickness on the pixel electrode, and to form a photoresist residue with the original thickness on the black matrix, by exposing and developing.

Figure 9B:
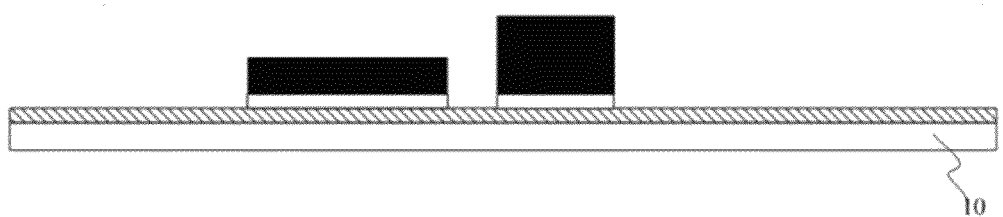
Figure 9C:
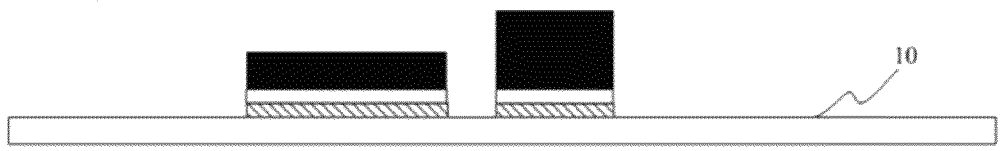

Referring to FIGS. 9B and 9C, a metal layer and a transparent conductive layer in regions other than the regions covered by the photoresist are etched away by a wet etching.

Figure 9D:
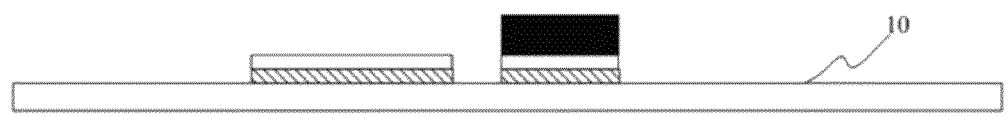

Referring to FIG. 9D, a full ashing is performed on the photoresist with half of the original thickness on the pixel electrode, and an ashing is performed on the photoresist on the black matrix, a photoresist with half of the original thickness being remained on the black matrix after the ashing.

Figure 9E:
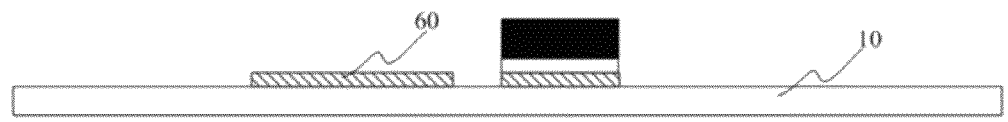
Figure 9F:
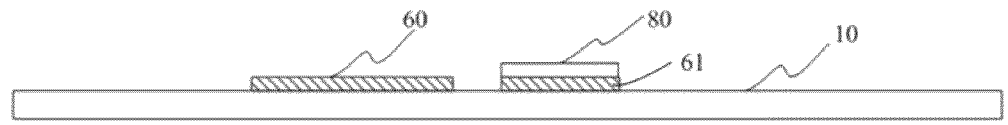

Referring to FIG. 9E, a metal layer on the pixel electrode is etched away completely by wet etching; and referring to FIG. 9F, the photoresist on the black matrix is stripped off after the etching, and finally forming the pixel electrode 60, the dummy electrode 61 and the black matrix 80.

In the method of fabricating the array substrate according to the embodiments of the present invention, the fabricating process regarding forming film layers by a patterning process is the same as above. Hereinafter, detail of this fabricating process will be omitted.

Figure 10:
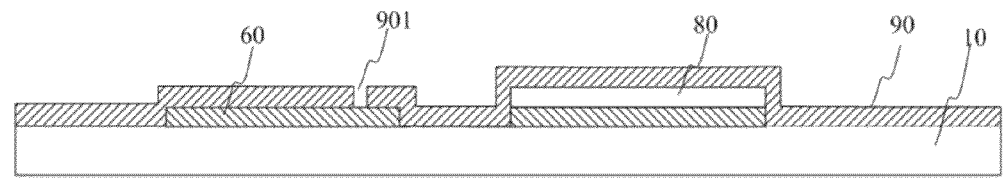
FIG. 10 is a cross sectional diagram of a structure of the array substrate with a second insulation layer fabricated therein.

In the second step, referring to FIG. 10, a silicon nitride or silicon oxide layer is deposited on the pattern comprising the pixel electrode 60 and the black matrix 80, to form a second insulation layer 90, the second insulation layer 90 covers the regions above the pixel electrode 60 and the black matrix 80, so that the pixel electrode 60 and the black matrix 80 are insulated from other layers; and the second via hole 901 is formed by a patterning process.

Figure 11:
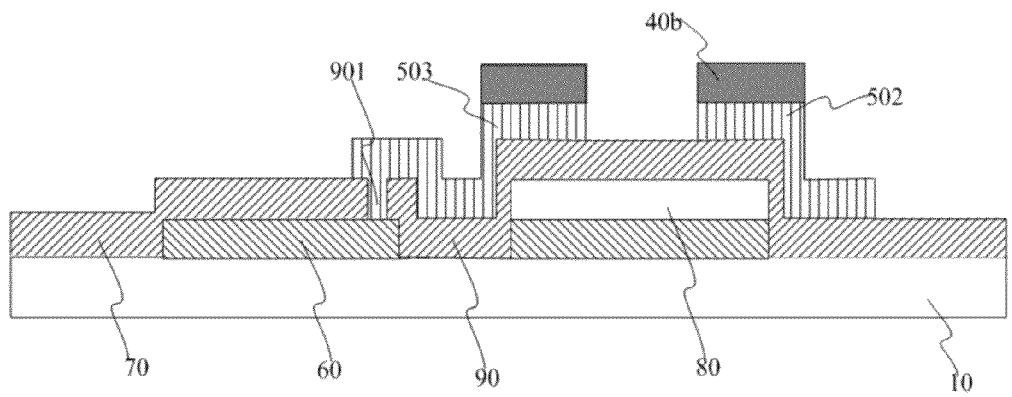
FIG. 11 is a cross sectional diagram of a structure of the array substrate with a data line, a source, a drain and an ohmic contact layer fabricated therein.

In the third step, referring to FIG. 11, a source and drain metal film and a phosphorus-doped amorphous silicon material are formed on the second insulation layer 90, and then a pattern comprising the data line 501, the source 502, the drain 503 and the ohmic contact layer 40b by a patterning process.

Figure 12:
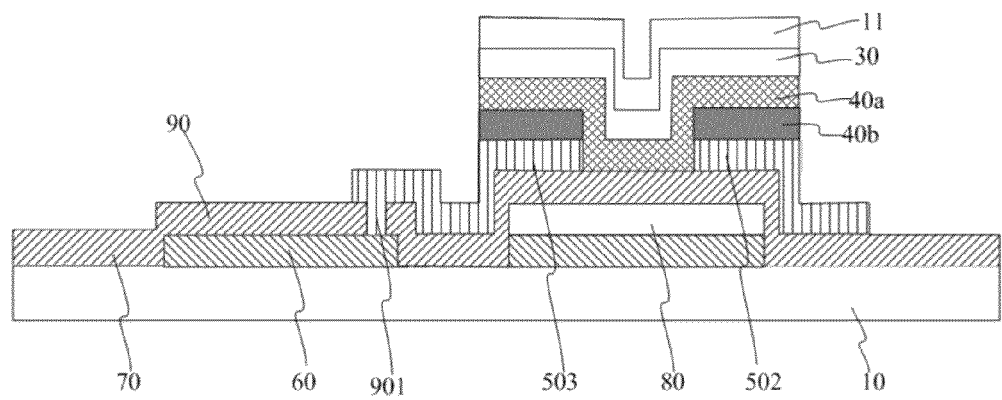
FIG. 12 is a cross sectional diagram of a structure of the array substrate with a semiconductor material layer, a first insulation layer and a gate fabricated therein.

In the fourth step, referring to FIG. 12, a semiconductor material layer such as amorphous silicon or poly-silicon, a transparent insulation material layer such as silicon oxide or silicon nitride, and a metal layer are sequentially deposited on the pattern comprising the data line 501, the source 502, the drain 503 and the ohmic contact layer 40b, and then a pattern comprising the semiconductor material layer 40a, the first insulation layer 30 and the gate 11 is formed by a patterning process; the semiconductor material layer 40a and the ohmic contact layer 40b formed in the third step form the active layer 40 of the thin film transistor.

Figure 13:
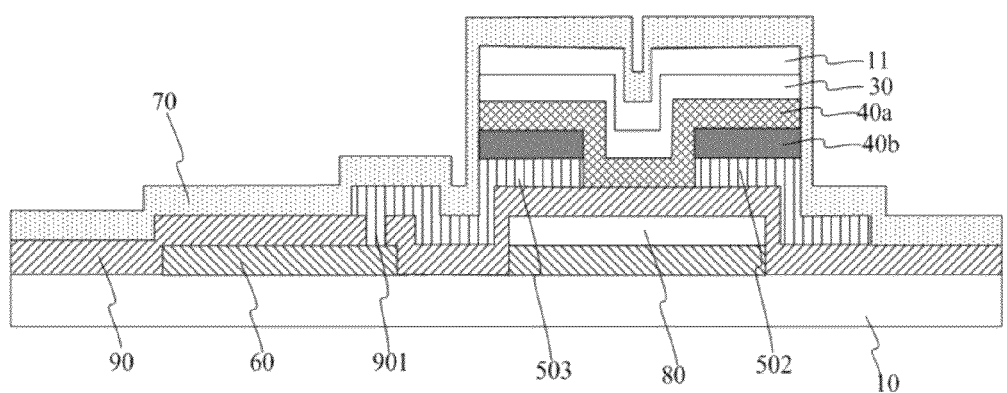
FIG. 13 is a cross sectional diagram of a structure of the array substrate with a passivation layer fabricated therein.

In the fifth step, referring to FIG. 13, a silicon nitride (SiNx) or silicon oxide (SiOx) layer is formed on the pattern comprising the semiconductor material layer 40a, the first insulation layer 30 and the gate 11, to form the passivation layer 70, so as to protect the thin film transistor from corrosion.

In the sixth step, referring to FIG. 4, a transparent conductive film layer of indium tin oxide is deposited on the passivation layer by a magnetron sputtering method, and a pattern comprising the common electrode 20 is formed by a patterning process.

The array substrate shown in FIG. 4 and provided in the first embodiment of the present invention is formed by the above six steps.

A method of fabricating the array substrate provided in the second embodiment is similar to that of fabricating the array substrate provided in the first embodiment, referring to FIGS. 14A through 14C, the differences therebetween are as follows.

Figure 14A:
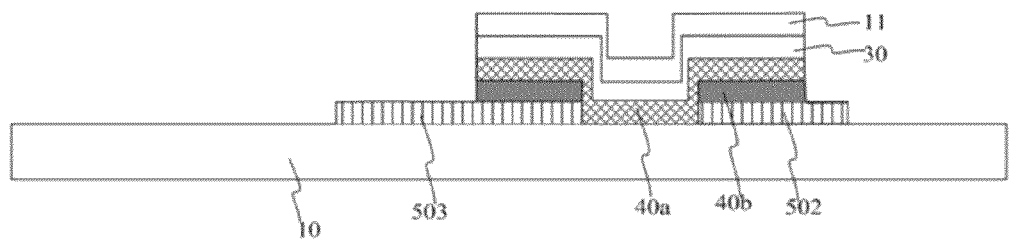
FIGS. 14A through 14C are cross sectional diagrams illustrating the method procedure of fabricating the array substrate according to the second embodiment of the present invention.

Referring to FIG. 14A, a pattern comprising the thin film transistor is formed on the base substrate 10; the fabricating procedure of the thin film transistor is substantially the same as that of the thin film transistor in the first embodiment. In addition, taking into account the effect of the light from backlight on the thin film transistor, while the active layer 40 of the thin film transistor is formed, a semiconductor oxide is used for fabricating the active layer 40.

Figure 14B:
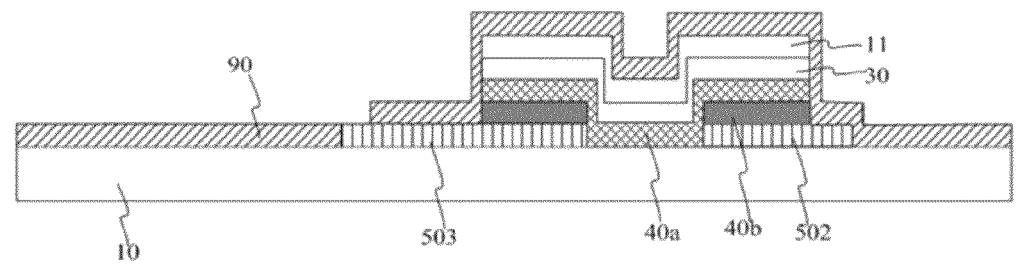

Referring to FIG. 14B, the second insulation layer 90 is formed on the pattern comprising the thin film transistor; the second via hole 901 is provided in the second insulation layer.

Figure 14C:
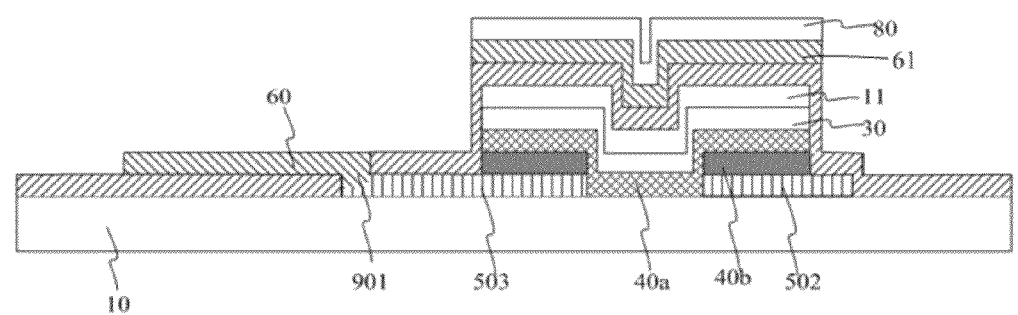

Referring to FIG. 14C, a pattern comprising the pixel electrode 60, the dummy electrode 61 and the black matrix 80 is formed on the second insulation layer 90, and the pixel electrode 60 is electrically connected to the drain 503 of the thin film transistor through the second via hole 901, detail procedure thereof will be omitted herein.

A method of fabricating the array substrate provided in the third embodiment is similar to that of fabricating the array substrate provided in the first embodiment, referring to FIGS. 15A through 15C, the differences therebetween are as follows.

Figure 15A:
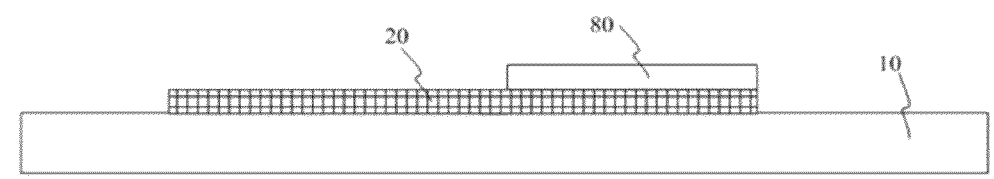
FIGS. 15A through 15C are cross sectional diagrams illustrating the method procedure of fabricating the array substrate according to the third embodiment of the present invention.

Referring to FIG. 15A, a pattern comprising the common electrode 20 and the black matrix 80 is formed on the base substrate 10, wherein the common electrode 20 is electrically connected to the black matrix 80.

Figure 15B:
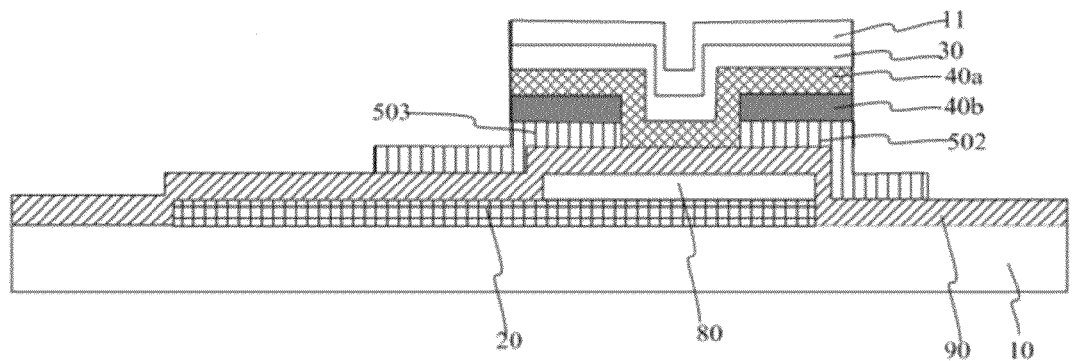

Referring to FIG. 15B, the second insulation layer 90 is formed on the pattern comprising the common electrode 20 and the black matrix 80, and the thin film transistor is formed on the second insulation layer 90.

Figure 15C:
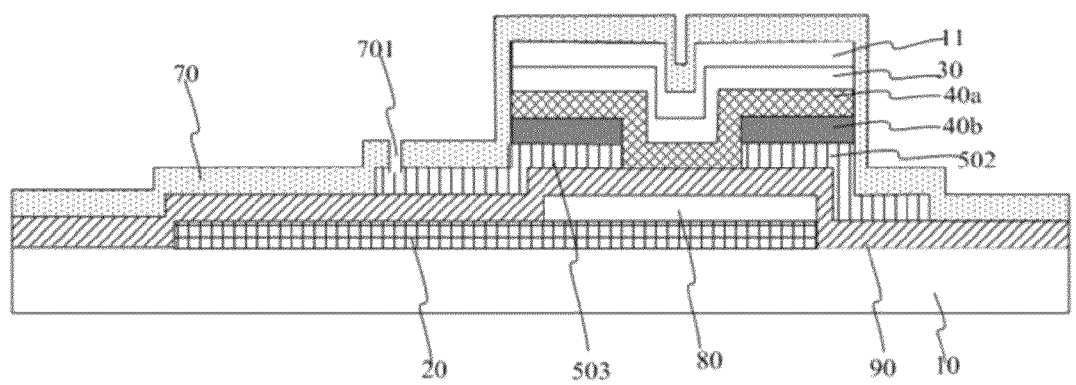

Referring to FIG. 15C, the passivation layer 70 is formed on the thin film transistor, and the first via hole 701 is formed in the passivation layer 70, so that the pixel electrode 60 formed in subsequent process is electrically connected to the drain 503 of the thin film transistor through the first via hole 701.

A method of fabricating the array substrate provided in the fourth embodiment is similar to that of fabricating the array substrate provided in the second embodiment, referring to FIGS. 16A through 16D, the differences therebetween are as follows.

Figure 16A:
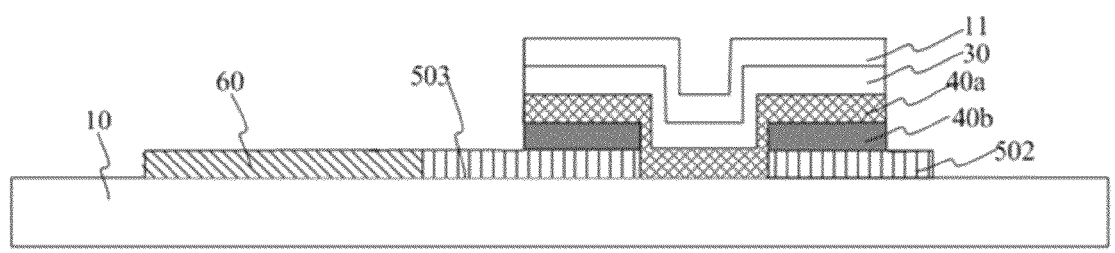
FIGS. 16A through 16D are cross sectional diagrams illustrating the method procedure of fabricating the array substrate according to the fourth embodiment of the present invention.
Figure 16B:
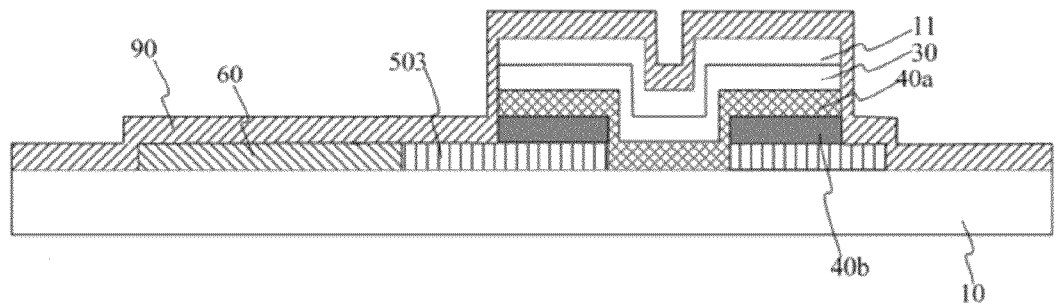
Figure 16C:
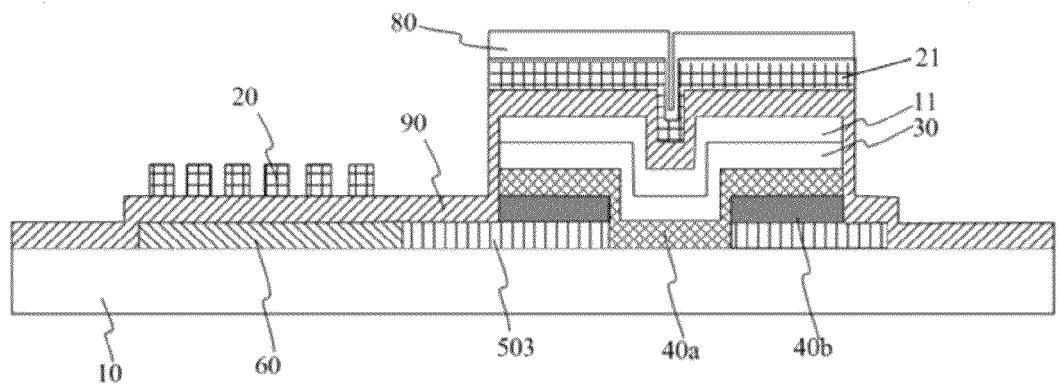
Figure 16D:
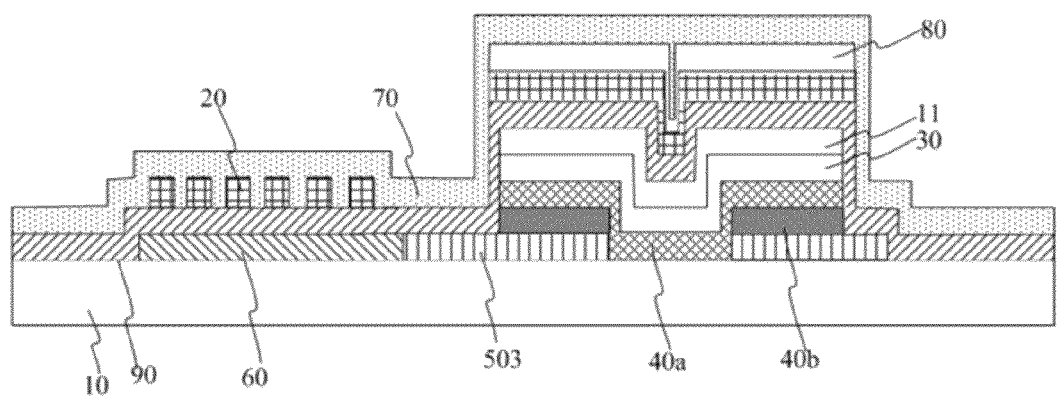

Referring to FIG. 16A, firstly, the thin film transistor and the pixel electrode 60 are formed on the base substrate 10, the pixel electrode 60 is directly electrically connected to the drain 503 of the thin film transistor; referring to FIG. 16B, the second insulation layer 90 is formed on the pixel electrode 60 and the thin film transistor; referring to FIG. 16C, a pattern comprising the common electrode 20, the dummy electrode 21 and the black matrix 80 is formed on the second insulation layer 90; and referring to FIG. 16D, the passivation layer 70 is formed on the pattern comprising the common electrode 20 and the black matrix 80.

There is also provided a display device in the embodiments of the present invention, the display device includes the array substrate described above.

In the array substrate according to the embodiments of the present invention, there is included the black matrix provided on the dummy electrode. Since the black matrix is provided on the array substrate, there is no need to consider the alignment permissible error, which facilitates the reduction of the width of the black matrix and increment of the aperture ratio of the pixel. Meanwhile, since the black matrix is provided on the dummy electrode, the first electrode and the black matrix may be formed by a single patterning process, thereby the process procedure of fabricating the black matrix is omitted, and the fabricating process is simplified, while achieving the object of saving fabricating cost and reducing fabricating period.

It will be apparent to those skilled in the art that modifications and variations can be made without departing from the spirit and scope of the present invention, and these modifications and variations are also considered to fall within the scope of protection of the present invention.

The invention claimed is:

1. An array substrate, including a base substrate and pixel units arranged in a matrix-type manner on the base substrate, a thin film transistor, a fist electrode and a second electrode being provided in the pixel unit, the thin film transistor including a gate, a first insulation layer, an active layer, a source and a drain, wherein the array substrate further includes:
a black matrix provided above the first electrode and covering a non-display region of each pixel unit;
a second insulation layer for allowing the black matrix and the first electrode to be insulated from the thin film transistor, a covering region of the second insulation layer being overlapped with covering regions of the black matrix and the first electrode; and
a passivation layer provided above a layer at which the thin film transistor locates and below the second electrode and covering a region above the thin film transistor.

2. The array substrate of claim 1, wherein the black matrix is made of non-transparent metal material.

3. The array substrate of claim 1, wherein the black matrix is provided between the thin film transistor and the base substrate, and the second insulation layer is provided between the black matrix and the thin film transistor.

4. The array substrate of claim 3, wherein the first electrode is a common electrode, and the second electrode is a pixel electrode;
the common electrode is a plate electrode, and the pixel electrode is a stripe electrode; and
the pixel electrode is electrically connected to the drain of the thin film transistor through a first via hole penetrating through the passivation layer.

5. The array substrate of claim 4, wherein the black matrix is provided on an upper surface of the common electrode, and the common electrode is electrically connected to the black matrix.

6. The array substrate of claim 3, wherein the first electrode comprises a pixel electrode, and the second electrode is a common electrode;
the pixel electrode is a plate electrode, and the common electrode is a stripe electrode; and
the drain of the thin film transistor is electrically connected to the pixel electrode through a second via hole penetrating through the second insulation layer.

7. The array substrate of claim 6, wherein the first electrode further comprises a dummy electrode, the dummy electrode and the pixel electrode are provided in the same layer, and the black matrix is provided on an upper surface of the dummy electrode;
the pixel electrode is located at a display region of the pixel unit, the dummy electrode is located at the non-display region of the pixel unit, and the pixel electrode is electrically separated from the dummy electrode.

8. The array substrate of claim 1, wherein the black matrix is provided between the thin film transistor and the passivation layer, and the second insulation layer is provided between the black matrix and the thin film transistor.

9. The array substrate of claim 8, wherein the first electrode comprises a pixel electrode, and the second electrode is a common electrode;
the pixel electrode is a plate electrode, and the common electrode is a stripe electrode; and
the pixel electrode is electrically connected to the drain of the thin film transistor through a second via hole penetrating through the second insulation layer.

10. The array substrate of claim 9, wherein the first electrode further comprises a dummy electrode, the dummy electrode and the pixel electrode are provided in the same layer, the dummy electrode is provided on an upper surface of the second insulation layer, and the black matrix is provided on an upper surface of the dummy electrode;
the pixel electrode is located at a display region of the pixel unit, the dummy electrode is located at the non-display region of the pixel unit, and the pixel electrode is electrically separated from the dummy electrode.

11. The array substrate of claim 8, wherein the first electrode is a pixel electrode, and the second electrode comprises a common electrode;
the pixel electrode is a plate electrode, and the common electrode is a stripe electrode; and
the pixel electrode and the source and the drain of the thin film transistor are provided in the same layer, and the pixel electrode is directly electrically connected to the drain.

12. The array substrate of claim 8, wherein the second electrode further comprises a dummy electrode, the dummy electrode and the common electrode are provided in the same layer, the dummy electrode is provided on an upper surface of the second insulation layer, and the black matrix is provided on an upper surface of the dummy electrode;
the common electrode is located at a display region of the pixel unit, the dummy electrode is located at the non-display region of the pixel unit, and the common electrode is electrically separated from the dummy electrode.

13. A display device, including an array substrate, wherein the array substrate includes a base substrate and pixel units arranged in a matrix-type manner on the base substrate, a thin film transistor, a fist electrode and a second electrode are provided in the pixel unit, the thin film transistor includes a gate, a first insulation layer, an active layer, a source and a drain, and wherein the array substrate further includes:
a black matrix provided above the first electrode and covering a non-display region of each pixel unit;
a second insulation layer for allowing the black matrix and the first electrode to be insulated from the thin film transistor, a covering region of the second insulation layer being overlapped with covering regions of the black matrix and the first electrode; and
a passivation layer provided above a layer at which the thin film transistor locates and below the second electrode and covering a region above the thin film transistor.

14. A method of fabricating an array substrate, the array substrate including pixel units arranged in a matrix-type manner on a base substrate, the method including:
forming a thin film transistor, a first electrode and a second electrode in the pixel unit on the base substrate, the thin film transistor including a gate, a first insulation layer, an active layer, a source and a drain;
forming a black matrix above the first electrode, the black matrix covering a non-display region of each pixel unit;
forming a second insulation layer for allowing the black matrix and the first electrode to be insulated from the thin film transistor, a covering region of the second insulation layer being overlapped with covering regions of the black matrix and the first electrode; and forming a passivation layer above a layer at which the thin film transistor locates and below the second electrode, the passivation layer covering a region above the thin film transistor.

15. The method of claim 14, wherein the first electrode comprises a function electrode and a dummy electrode, the function electrode is located at a display region of the pixel unit, the dummy electrode is located at the non-display region of the pixel unit, the black matrix is formed on an upper surface of the dummy electrode, and the function electrode is electrically separated from the dummy electrode.

16. The method of claim 14, wherein the second insulation layer is formed on the first electrode and the black matrix.

17. The method of claim 16, wherein forming the thin film transistor on the base substrate includes:
   forming a pattern comprising a source and a drain on the second insulation layer; and
   forming a pattern comprising an active layer, a first insulation layer and a gate on the pattern comprising the source and the drain,
   wherein the passivation layer is formed on the pattern comprising the active layer, the first insulation layer and the gate, and the passivation layer covers the thin film transistor.

18. The method of claim 17, wherein
   the second electrode is formed on the passivation layer, and the second electrode is located at the display region of the pixel unit.

* * * * *